(12) United States Patent
Loboda (10) Patent No.: US 11,131,038 B2
(45) Date of Patent: Sep. 28, 2021

(54) FURNACE FOR SEEDED SUBLIMATION OF WIDE BAND GAP CRYSTALS

(71) Applicant: SK SILTRON CSS, LLC, Wilmington, DE (US)

(72) Inventor: Mark Loboda, Bay City, MI (US)

(73) Assignee: SK SILTRON CSS, LLC, Wilmington, DE (US)

( * ) Notice: Subject to any disclaimer, the term of this patent is extended or adjusted under 35 U.S.C. 154(b) by 0 days.

(21) Appl. No.: 16/504,172

(22) Filed: Jul. 5, 2019

(65) Prior Publication Data

US 2019/0330763 A1   Oct. 31, 2019

Related U.S. Application Data

(62) Division of application No. 15/548,082, filed as application No. PCT/US2016/015773 on Jan. 29, 2016, now Pat. No. 10,344,396.

(60) Provisional application No. 62/112,622, filed on Feb. 5, 2015.

(51) Int. Cl.
   *C30B 23/06*   (2006.01)
   *C30B 29/36*   (2006.01)
   (Continued)

(52) U.S. Cl.
   CPC .............. *C30B 23/06* (2013.01); *C30B 29/36* (2013.01); *C30B 30/00* (2013.01); *C30B 30/04* (2013.01)

(58) Field of Classification Search
   CPC ......... C30B 23/06; C30B 29/36; C30B 30/00; C30B 30/04
   See application file for complete search history.

(56) References Cited

U.S. PATENT DOCUMENTS 2,854,364 A   9/1958 Lely
4,619,811 A   10/1986 Nishizawa
(Continued)

FOREIGN PATENT DOCUMENTS

JP   2013-075793 A   4/2013
JP   2013075793 A * 4/2013
(Continued)

OTHER PUBLICATIONS

Duncan, C.S., et al., Low-Frequency Induction Heating for Crystal Growing, Journal of Crystal Growth, vol. 11, Issue 1, Oct. 1971, pp. 50-52.
(Continued)

*Primary Examiner* — Hua Qi
(74) *Attorney, Agent, or Firm* — KED & Associates LLP (57) ABSTRACT

An apparatus for physical vapor transport growth of semiconductor crystals having a cylindrical vacuum enclosure defining an axis of symmetry; a reaction-cell support for supporting a reaction cell inside the vacuum enclosure; a cylindrical reaction cell made of material that is transparent to RF energy and having a height Hcell defined along the axis of symmetry; an RF coil provided around exterior of the vacuum enclosure and axially centered about the axis of symmetry, wherein the RF coil is configured to generate a uniform RF field along at least the height Hcell; and, an insulation configured for generating thermal gradient inside the reaction cell along the axis of symmetry. The ratio of height of the RF induction coil, measured along the axis of symmetry, to the height Hcell may range from 2.5 to 4.0 or from 2.8 to 4.0.

10 Claims, 5 Drawing Sheets

(51) Int. Cl.
*C30B 30/04* (2006.01)
*C30B 30/00* (2006.01)

(56) References Cited

U.S. PATENT DOCUMENTS

| | | | | |
|---|---|---|---|---|
| 4,823,735 | A | * | 4/1989 | Pichel .................. C23C 16/481 118/730 |
| 4,866,005 | A | | 9/1989 | Davis et al. |
| 5,207,578 | A | * | 5/1993 | Sakata .................. C30B 31/16 432/241 |
| 5,219,226 | A | * | 6/1993 | James .................. G01J 5/02 345/167 |
| 5,968,267 | A | | 10/1999 | Li |
| 6,056,820 | A | | 5/2000 | Balakrishna et al. |
| 2001/0000864 | A1 | | 5/2001 | Shiomi .................. C30B 29/36 117/84 |
| 2004/0192015 | A1 | | 9/2004 | Ammom et al. |
| 2005/0087753 | A1 | * | 4/2005 | D'Evelyn .................. C30B 9/00 257/98 |
| 2006/0042540 | A1 | | 3/2006 | Futatsuyama et al. |
| 2007/0209577 | A1 | * | 9/2007 | Powell .................. C30B 29/36 117/87 |
| 2011/0056434 | A1 | | 3/2011 | Yamaguchi et al. |
| 2011/0306212 | A1 | | 12/2011 | Sato et al. |
| 2012/0025153 | A1 | * | 2/2012 | Hirose .................. C30B 31/00 252/516 |
| 2012/0114545 | A1 | * | 5/2012 | Loboda .................. C01B 32/90 423/345 |
| 2013/0256700 | A1 | * | 10/2013 | Ishibashi .......... H01L 21/02002 257/77 |

FOREIGN PATENT DOCUMENTS

JP 2013-216549 A 10/2013
WO 2016/126554 A1 8/2016

OTHER PUBLICATIONS

Hull, B.A., et al., Development of Large Area (up to 1.5 cm2) 4H-SiC 10 kV Junction Barrier Schottky Rectifiers, Materials Science Forum, vols. 600-603, 2009, pp. 931-934.
Konstantinov, A.O., 8.2: Sublimation growth of SiC, Properties of Silicon Carbide, G.L. Harris, ed., Inspec, ISBN 0 85296 870 1, 1995, Chapter 8, pp. 170-203.
Lendenmann, H., et al., Operation of a 2500V 150A Si-IGBT / SiC Diode Module, Materials Science Forum, vols. 338-342, 2000, pp. 1423-1426.
Neudeck, P.G., Electrical Impact of SiC Structural Crystal Defects on High Electric Field Devices, Materials Science Forum, vols. 338-342, 2000, pp. 1161-1166.
Neudeck, P.G., et al., Performance Limiting Micropipe Defects in Silicon Carbide Wafers, IEEE Electron Device Letters, vol. 15, No. 2, Feb. 1994, pp. 63-65.
Potter, R.M., et al., Induction-heated furnace for growth of alpha-silicon carbide crystals, Journal of Crystal Growth, vol. 12, Issue 3, Mar. 1972, pp. 245-248.
Powell, J.A., et al., Process-Induced Morphological Defects in Epitaxial CVD Silicon Carbide, Phys. Stat. Sol. (b), vol. 202, Issue 1, Jul. 1997, pp. 529-548.
Powell, J.A., et al., Sources of Morphological Defects in SiC Epilayers, Transactions Third International High-Temperature Electronics Conference, vol. 1, pp. II-3-II-8, Sandia National Laboratories, Albuquerque, N.M. USA, Jun. 9-14, 1996.
Tairov, Y.M., et al., General Principles of Growing Large-Size Single Crystals of Various Silicon Carbide Polytypes, Journal of Crystal Growth, vol. 52, Part 1, Apr. 1981, pp. 146-150.
Tairov, Y.M, et al., Progress in Controlling the Growth of Polytypic Crystals, in Progress in Crystal Growth and Characterization, vol. 7, Ed. P. Krishna, Pergamon Press, Oxford, 1983, pp. 111-161.
Wan, J., et al., A Comparative Study of Micropipe Decoration and Counting in Conductive and Semi-Insulating Silicon Carbide Wafers, J. Electronic Materials, vol. 34, No. 10, 2005, pp. 1342-1348.
Wolf, S., et al., Silicon Processing for the VLSI Era, vol. 1: Process Technology, Chapter 1, Lattice Press, 1986.
Zhou, L., et al., Chemomechanical Polishing of Silicon Carbide, J. Electrochem. Soc., vol. 144, No. 6, Jun. 1997, pp. L161-L163.
International Search Report for PCT/US2016/015773 dated May 13, 2016.
International Preliminary Report on Patentability for PCT/US2016/015773 dated Aug. 17, 2017.
Taiwan Office Action dated Mar. 30, 2020 issued in Application 105103469.

* cited by examiner

FURNACE FOR SEEDED SUBLIMATION OF WIDE BAND GAP CRYSTALS

CROSS-REFERENCE TO RELATED APPLICATIONS

This application is a divisional of U.S. patent application Ser. No. 15/548,082, filed on Aug. 1, 2017 (now U.S. Pat. No. 10,344,396), which is the national phase of International Application No. PCT/US2016/015773, filed on Jan. 29, 2016, which claims priority to and the benefit of U.S. Provisional Patent Application No. 62/112,622, filed on Feb. 5, 2015, the disclosures of which are hereby incorporated by reference herein in their entireties.

BACKGROUND

1. Field

This disclosure relates to Physical Vapor Transport (PVT) growth of SiC and, more specifically, to the construct of the PVT apparatus.

2. Related Arts

Silicon carbide, SiC, is a crystalline semiconductor material, recognized by those familiar with materials science, electronics and physics as being advantageous for wide band gap properties and also for extreme hardness, high thermal conductivity and chemical inert properties. These properties make SiC a very attractive semiconductor for fabrication of power semiconductor devices, enabling power density and performance enhancement over devices made from more common materials like silicon.

The most common forms of SiC consist of cubic or hexagonal arrangements of atoms. The stacking of Si and C layers can take on many forms, known as polytypes. The type of silicon carbide crystal is denoted by a number denoting the number of repeat units in the stacking sequence followed by a letter representing the crystalline format. For example the 3C—SiC polytype refers to a repeat unit of 3 and a cubic (C) lattice, while a 4H-SiC polytype refers to repeat unit of 4 and a hexagonal (H) lattice.

The different silicon carbide polytypes have some variations in materials properties, most notably electrical properties. The 4H-SiC polytype has the relatively larger bandgap while the 3C—SiC has a smaller bandgap, with the bandgaps for most other polytypes falling in between. For high performance power device applications when the bandgap is larger, the material is more capable, in theory, to offer relatively higher high power and thermal conductivity performance.

SiC crystals do not occur in nature and as such must be synthesized. Growth of SiC crystals can be executed by sublimation/physical vapor transport or chemical vapor deposition.

Growth of SiC by seeded sublimation is very challenging. In seeded sublimation temperatures in excess of 2000 C are required to generate as vapor stream of Si/C species by sublimation, which places great limitations on the reaction cell components and the furnace design. Originally SiC abrasive materials formed by processes like the Acheson method were used as the source of the Si and C atoms for the crystal, and as the technology matured groups developed means to synthesize SiC source powder specifically for SiC crystal growth. The graphite container is heated by induction. The container is insulated in a careful manner as to create controlled temperature gradients within the volume. A seed crystal is used and usually shaped like a plate or disc. The seed crystal is typically oriented with its growth surface facing the source material. The location of the seed crystal in the container is designed such that when the container is heated the seed is at a relatively lower temperature position, while the Si—C source materials are at the higher temperature position. When the container is heated to a temperature sufficient to sublime the source material, the vapors will travel towards the low temperature region and condense on the seed crystal. While this appears simple in concept, in practice the growth of SiC is very complicated and recognized by those who practice as very difficult to perform.

Furnace designs for sublimation growth have been reported. Duncan, et. al, (*Journal of Crystal Growth* 11 (1971), p. 50-52) disclosed a design of an induction furnace for crystal growth. Potter and Sattelle (*Journal of Crystal Growth* 12 (1972) 245-248) reported a design of RF induction furnaces for silicon carbide crystal growth by the Lely sublimation method. Konstantinov (*Properties of Silicon Carbide*, G. L. Harris, ed., Inspec, ISBN 0 85296 870 1, (1995), pp. 170-3) details the configuration and use of an RF induction furnace for seeded sublimation growth of SiC. The induction furnace is comprised of a nonmetallic cylindrical vacuum chamber (e.g. quartz or glass) which may be water cooled or cooled by convection using a fan. A cylindrical induction coil surrounds the vacuum chamber. A means to supply controlled amounts of gas is also provided. In SiC crystal growth the gases are typically inert gas such as argon and doping gas such as nitrogen. The temperature of the reaction cell is measured by optical pyrometry from the top and or bottom, and the pyrometer output is delivered to a computer controller which executes a program to control the RF power, temperature, pressure and gas flow during growth. Konstantinov indicates that the important advantage of induction type furnaces is the convenience of temperature field regulation. Both value and sign of the temperature gradient in the crucible can be varied by displacement of the inductor coil along the axis relative to the reaction cell.

Historically, initial progress in SiC sublimation-based crystal growth is described first by Lely (U.S. Pat No. 2,854,364—1958) whose method of unseeded crystal growth resulted in small hexagonal SiC platelets. In the 1970s and 1980s the art to produce the first crystals of size attractive for producing devices was done in Russia by Tairov and Tsvetkov (*Journal of Crystal Growth*, 52 (1981) p. 146-50 and *Progress in Controlling the Growth of Polytypic Crystals in Crystal Growth and Characterization of Polytype Structures*, P. Krishna, ed., Pergammon Press, London, p. 111 (1983)). Their approach used a Lely crystal as a seed, and conducted growth by sublimation and transport as described above. These results showed methods for polytype control by choice of seeds, pressure control and temperature gradients. Later, Davis (U.S. Pat. No. 4,866, 005—1989) revealed improvements by judicious selection of source materials and gradient controls. Refinements on the methods of Tairov, Tsvetkov and Davis continue to be revealed to this day.

In the methods of silicon carbide crystal growth the reaction cell is typically constructed of a dense isostatic graphite shell which is surrounded by graphite insulation. In the Lely sublimation method of sublimation growth the objective is to design the furnace and reaction cell for minimum temperature gradients. In seeded sublimation method, optimization of crystal quality is intimately linked to the ability to establish control of the axial and radial temperature gradients during growth. The axial gradient is adjusted so that the seed temperature is just slightly cooler than the temperature in the source material. Radial gradients are adjusted so that the shape of the growth front on the seed crystal is flat to slightly convex. The gradients can be established two ways, first by control of the RF fields and coupling of the fields at the reaction cell and second, by limiting thermal insulation of the reaction cell in certain locations to accentuate heat loss. Due to the high temperature associated with seed sublimation crystal growth there is no way to directly monitor the temperature gradients at the seed crystal, design of the reaction cell and coil to establish the required temperature gradients is typically performed by finite element analysis modeling. As noted by Konstantinov the properties of graphite are highly variable and this will limit reproducibility in crystal growth. What's more, the models cannot accurately predict heat flow due to unavailability of accurate materials constants at high temperatures. In turn this results in inaccuracy to model the coupling between the coil and the reaction cell and the coil and the furnace geometry. All combined these issues result in several parasitic errors and discontinuity between the model and the growth result.

When methods to produce larger crystals emerged, focus also moved to control defects in the crystals. Defects can be categorized as inclusions and crystal dislocations. The primary crystalline defects in SiC crystals are screw dislocations. Among these are a special case known as a micropipe or hollow core screw dislocations. Additionally, there are basal plane dislocations and threading edge dislocations. These defects originate from many sources. For example, defects contained in the seed crystal can be passed to the newly grown crystal volume. Stresses arising from temperature gradients and thermal expansion mismatch and imparted to the seed and crystal during growth can result in formation of dislocations. Deviation of the stoichiometry in the sublimation vapor stream from that needed to form SiC can result in unstable polytype growth—in turn leading to polytype inclusions in the grown crystal, which lead to dislocation formation at the polytype boundaries. Even interactions between dislocations can create or eliminate dislocations.

SiC crystals produced by methods identified have large concentrations of dislocations. As of this filing, the commonly reported values of screw dislocation and basal plane concentration are nominally 5000-10000/cm2, respectively. The dislocations are most commonly assessed by sectioning the crystal in the plane normal to the crystal axis of symmetry. Etching the exposed crystal surface with molten salt, like potassium hydroxide, at temperatures in the 350-500 C range will reveal the dislocations. Each dislocation type has a unique shape so they can be uniquely counted. The dislocations are commonly counted and reported as a number divided by the inspection area. This characterization method is useful as it allows for easy correlation of defects contained in planar semiconductor devices formed on the crystal plane. There are many examples in the literature which show that dislocations are not uniformly distributed in the plane of observation. The large count of dislocations makes it very impractical to count every single one, especially as today inspections can be required on sections greater than or equal to the equivalent of 100 mm diameter circles. So the etched area sampled to determine the amount of dislocations. Incorrect sampling methods can lead to errors in the estimation of the dislocation concentration associated with larger crystals. In most reports, the details of the sampling method are not provided, so replication of results can often be difficult, if not impossible.

Scientists experienced in solid state physics and semiconductor devices know that dislocations result in device performance below the theoretical properties of the material. Therefore modern effort focused on improvements of semiconductor SiC crystal quality look to identify and control the factors which can reduce defects originating in crystal growth.

Once large enough crystals are produced the crystal must be cut and fabricated into wafers in order to be useful in devices to fabricate semiconductor devices using planar fabrication methods. As many semiconductor crystals (e.g. silicon, gallium arsenide) have been successfully developed and commercialized into wafer products the methods to fabricate wafers from bulk crystals are known. A review of the common approaches to, and requirements for wafer fabrication and standard methods of characterization can be found in Wolf and Tauber, *Silicon Processing for the VLSI Era, Vol. 1—Process Technology*, Chapter 1 (Lattice Press—1986).

Due to its hardness, fabrication of SiC into wafer substrates presents unique challenges compared to processing other common semiconductor crystals like silicon or gallium arsenide. Modifications must be made to the machines and the choices of abrasives changed beyond commonly used materials. The modifications made on common wafer fabrication techniques in order to accommodate SiC are often kept as proprietary information by their inventors. It has been reported that substantial subsurface damage is observable on mirror polished SiC wafers, and this can be reduced or removed by using chemical enhanced mechanical polishing methods similar to that used in the silicon industry (Zhou, L., et al., *Chemomechanical Polishing of Silicon Carbide, J. Electrochem. Soc.*, Vol. 144, no. 6, June 1997, pp. L161-L163).

In order to build semiconductor devices on SiC wafers additional crystalline SiC films must be deposited on the wafers to create the device active regions with the required conductivity value and conductor type. This is typically done using chemical vapor deposition (CVD) methods. Techniques for growth of SiC by CVD epitaxy have been published from groups in Russia, Japan and the United States since the 1970's. The most common chemistry for growth of SiC by CVD is a mixture of a silicon containing source gas (e.g., monosilanes or chlorosilanes) and a carbon containing source gas (e.g., a hydrocarbon gas). A key element to growth of low defect epitaxial layers is that the substrate surface is tilted away from the crystal axis of symmetry to allow the chemical atoms to attach to the surface in the stacking order established by the substrate crystal. When the tilt is not adequate the CVD process will produce three dimensional defects on the surface, and such defects will result non-operational semiconductor devices. Surface imperfections, such as cracks, subsurface damage, pits, particles, scratches or contamination will interrupt the replication of the wafer's crystal structure by the CVD process (see, for example, Powell and Larkin, *Phys. Stat. Sol.* (b) 202, 529 (1997)). It is important that the polishing and cleaning processes used to fabricate the wafer minimize surface imperfections. In the presence of these surface imperfections several defects can be generated in the epitaxial films including basal plane dislocations and cubic SiC inclusions (see for example, Powell, et. al. *Transactions Third International High-Temperature Electronics Conference*, Volume 1, pp. II-3-II-8, Sandia National Laboratories, Albuquerque, N. Mex. USA, 9-14 Jun. 1996).

Defects in SiC are known to limit or destroy operation of semiconductor devices formed over the defects. Neudeck and Powell reported that hollow core screw dislocations (micropipes) severely limited voltage blocking performance in SiC diodes (P. G. Neudeck and J. A. Powell, *IEEE Electron Device Letters, vol.* 15, *no.* 2, pp. 63-65, (1994)). Neudeck reviewed the impact of crystal (wafer) and epitaxy originated defects on power devices in 1994 highlighting limitations of power device function due to screw dislocations and morphological epitaxy defects (Neudeck, *Mat. Sci. Forum, Vols* 338-342, pp. 1161-1166 (2000)). Hull reported shift to lower values in the distribution of high voltage diode reverse bias leakage current when the diodes were fabricated on substrates having lower screw dislocation density (Hull, et. al., *Mat. Sci. forum, Vol.* 600-603, p. 931-934 (2009)). Lendenmann reported forward voltage degradation in bipolar diodes was linked to basal plane dislocations in the epilayer that originate from basal plane dislocations in the substrate (Lendenmann et. al., *Mat. Sci. Forum, Vols* 338-342, pp. 1423-1426 (2000)).

In order to achieve reproducible manufacturing of wide band gap crystals like SiC and AlN, it is necessary to achieve control of the temperature gradients. Reaction cell materials and furnace designs have direct impact on this control.

JP 2013216549A discloses a heating coil that is located outside of a side part of the crucible body and performs induction heating of the reaction cell, or crucible, and includes a bottom side heating coil that is located outside of the bottom part of the crucible body, opposing to the opening, and performs induction heating of the crucible. This arrangement is claimed to give control of the temperature gradients in the crucible.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Contrary to JP 2013216549A, the inventors have discovered that efficient control of temperature gradients in seeded sublimation is best achieved by designing the RF coil so that perturbations of the RF field that result in creation of temperature gradients in the reaction cell are minimized. The inventors have unexpectedly found that there is a critical ratio of the axial height of the coil to the axial height of the reaction cell. When this ratio is too low, the ends of the coil are too close to the reaction cell and the RF fields become non-linear, resulting in unpredictable temperature gradients in the reaction cell. In this respect, the coil height is defined as the length along the axis of the coil, and the reaction cell's height is defined as the length along the axis of the cell, which does not include any insulation. The reaction cell can be the container body which holds the source and seed material or it can be a susceptor container which encloses an inner cell holding the seed and source material.

According to disclosed aspects, the coil is designed so as to provide uniform temperature distribution, rather than create a gradient. As a result, the control of the temperature gradients is primarily controlled by the design of the reaction cell and placement of thermal insulation around the reaction cell, not the coil. By decoupling of the temperature gradient effects of the induction coil and reaction cell, highly reproducible crystal growth is achieved. This design strategy is particularly effective to grow crystals with diameters equal to or greater than 100 mm.

According to disclosed embodiments, an induction furnace apparatus for growing semiconductor crystals by seeded sublimation growth is provided, comprising: a quartz vacuum chamber; an RF induction coil positioned around exterior of the quartz vacuum chamber; an RF power supply coupled to the RF induction coil; a reaction cell configured for containing a seed crystal and source material, the reaction cell defining an axial length measured as the reaction cell height along its axis of rotational symmetry; a support for placing the reaction cell inside the quartz vacuum chamber; an insulation wrap outside the reaction cell configured for generating thermal gradient inside the reaction cell; and, wherein the RF induction coil is configured for generating uniform inductive heating of the reaction cell. In some embodiments, the ratio of height of the RF induction coil, measured along the axis of rotational symmetry, to the axial length of the reaction cell ranges from 1.8 to 4.0, from 2.0 to 5.0, from 2.5 to 4.0, or from 2.8 to 4.0. The reaction cell and the insulation are made of graphite. In some embodiments, the diameter of the reaction cell is configured to accommodate growth of crystals of from 76 to 200 mm diameter. The height of the RF induction coil, measured along the axis of rotational symmetry, may be smaller than height of the quartz vacuum chamber, measured along the axis of rotational symmetry, but longer than the axial length of the reaction cell. The reaction cell support can be made of material to which RF fields do not effectively couple. The RF induction coil may have internal diameter of from 330 to 725 mm or from 330 to 550 mm. A water jacket may be positioned on exterior wall of the quartz vacuum chamber. The support may comprise ferrofluidic seal engaging a bottom opening of the quartz vacuum chamber.

According to further embodiments, an apparatus for physical vapor transport growth of semiconductor crystals is provided, comprising: a cylindrical vacuum enclosure made of material that is transparent to RF radiation, the vacuum enclosure defining an axis of symmetry; a reaction-cell support made up in part of materials transparent to RF energy and configured for supporting a reaction cell inside the vacuum enclosure, such that the reaction cell is positioned axially centrally to the axis of symmetry; a cylindrical reaction cell having a height Hcell defined along the axis of symmetry; an RF coil provided around exterior of the vacuum enclosure and axially centered about the axis of symmetry, wherein the RF coil is configured to generate a uniform RF field along at least the height Hcell; and, an insulation configured for generating thermal gradient inside the reaction cell. The ratio of height of the RF induction coil, measured along the axis of symmetry, to the height Hcell may range from 1.8 to 4.0, from 2.0 to 5.0, from 2.5 to 4.0 or from 2.8 to 4.0. The RF coil may have internal diameter of from 330 to 725 mm or from 330 to 550 mm. The reaction cell support may be made of material to which RF fields do not effectively couple. The reaction cell and the insulation may be made of graphite. The reaction-cell support may comprise ferrofluidic seal engaging a bottom opening of the quartz vacuum chamber. A water jacket may be positioned on exterior wall of the quartz vacuum chamber.

According to yet further aspects, a method for physical vapor growth of semiconductor crystal is provided, comprising: placing a seed and source material inside a reaction cell having a height Hcell, defined as the height along the reaction cell's axis of symmetry; placing the reaction cell inside a quartz vacuum chamber; providing insulation configured to generate thermal gradient inside the reaction cell;

generating vacuum inside the quartz vacuum chamber; and, generating an RF field inside the vacuum chamber, wherein the RF field is uniform for a length at least as long as the height Hcell. The seed crystal may be a hexagonal polytype of single crystal SiC or a single crystal aluminum nitride. The RF field may be made uniform by making the RF coil having a height, defined along the axis of symmetry that is from 1.8 to 4.0, from 2.0 to 5.0, from 2.6 to 4.0 longer than the height Hcell.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a schematic illustrating a furnace construction according to one embodiment, while

DETAILED DESCRIPTION

Various disclosed embodiments relate to the design of an inductive PVT reaction furnace. For proper growth of SiC, thermal gradient needs to be established, wherein the area occupied by the source material is hotter than the area occupied by the SiC seed. According to embodiments disclosed below, the thermal gradient is achieved by designing an induction coil that generates a rather uniform heating field within the area occupied by the reaction cell. However, the reaction cell and the insulation are designed to cause a none-uniform heat loss from the reaction cell.

According to some specific examples, the range of minimum ratio value of coil height to reaction cell height defined as Ratio=(axial length of coil)/(axial length of reaction cell)

is 1.8 to 4.0, 2.0 to 5.0, 2.0-4.0, and preferred value range of nominally 2.8-4.0. Larger ratios will not impact crystal growth but will make the construction of large furnaces more expensive and difficult to assemble and maintain. When the application is required for a furnace design to accommodate growth of larger crystals, it is discovered that the critical length ratio (defined above) is invariant to increased diameter.

Figure 1:
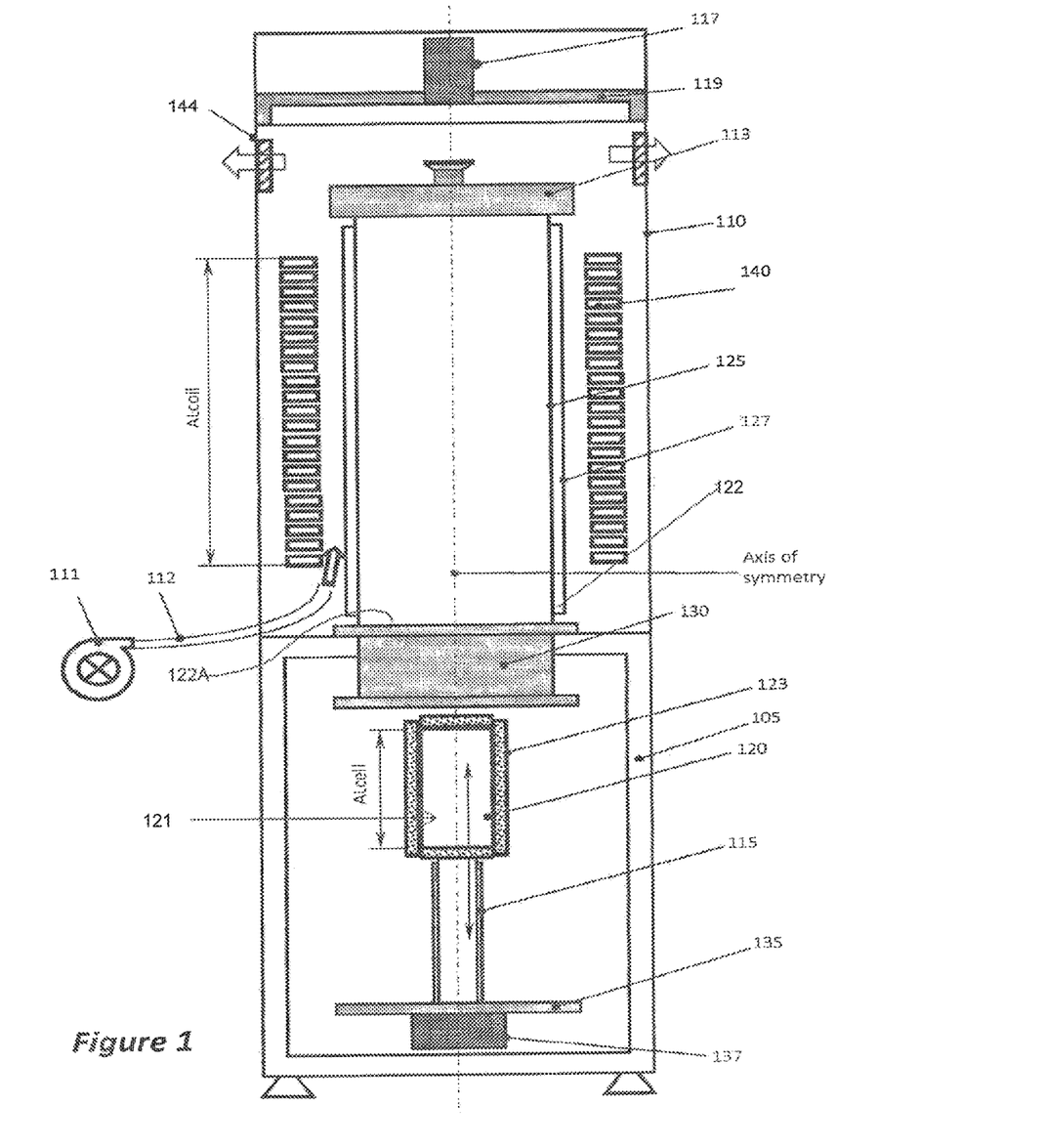

FIG. 1 illustrates one embodiment of a growth chamber utilizing features of the invention. In the example of FIG. 1, an enclosure 110 is supported by cabinet 105, which forms the base of the apparatus. A support, in the form of tubular pedestal 115 supports the reaction cell (container or susceptor container) 120, and is movable in the vertical direction. The reaction cell 120 can be the container body which holds seed crystal and source material 121 or it can be a susceptor container which encloses an inner cell holding the seed crystal and source material 121. In FIG. 1 the tubular pedestal 115 is illustrated in its retracted position. However, in its extended position the tubular pedestal 115 places the reaction cell 120 within the processing chamber's inner tube 125, wherein the bottom base plate 135 contacts and seals the chamber base 130 at a bottom portion 122A of a quartz vacuum chamber 122, so that the interior of the inner chamber tube 125 can be maintained in vacuum. The chamber base 130 and the base plate 135 may be water cooled. Also, an outer sleeve (or water jacket) 127 may be provided over inner tube 125 to provide water cooling, and a chamber cap 113 seals the top of the inner tube 125 and may also be water cooled. The base plate 135 may be attached to a seal adapter 137, which may comprise a Ferrofluidic seal. Seal adapter 137 may also incorporate a rotation motor to rotate the reaction cell during the growth process, and fiberoptic pyrometer head for temperature measurement. Neither the rotation motor nor the fiberoptic pyrometer head are specifically illustrated in FIG. 1. A top pyrometer 117 measures the temperature at the top of the insulated reaction cell. In this example, the pyrometer 117 is attached to a pyrometer X-Y translation stage 119 to enable measurements at different locations.

The cylindrical RF coil 140 is around and coaxially aligned to the inner tube 125. The coil 140 is designed so as to impart uniform electromagnetic field within the inner tube 125. In particular, the coil will create an electromagnetic field such that perturbations of the field by the presence of the reaction cell are very small as along as the reaction cell is positioned near the center of the coil. In the example of FIG. 1, the ratio of the axial length of the coil (marked as ALcoil) to the height, i.e., the axial length of the reaction cell (marked as ALcell) set to 2.0-4.0. In this manner, the effect of the induction coil design is such that the design of the reaction cell (geometry, wall thickness, insulation 123, etc.) will primarily determine the degree and uniformity of the temperature in the sublimation zone. In order to minimize effects of the vacuum chamber on the RF fields in the cell, the flanges of the chamber should be made of aluminum or austenitic grades of steel. The ratio of the height of the chamber, including the endcaps, to the height of the coil should be 1.7 to 2.0 times the ALcoil or larger.

The coil design, according to disclosed embodiments, generates a uniform field along the axial length of the inner tube for a length that is at least equal the height of the reaction crucible. The reaction crucible is then placed within this uniform field for the duration of the crystal growth. In some embodiments the uniform field is generated over a length that is longer than the height of the reaction cell, so as to provide safety margin.

Figure 1A:
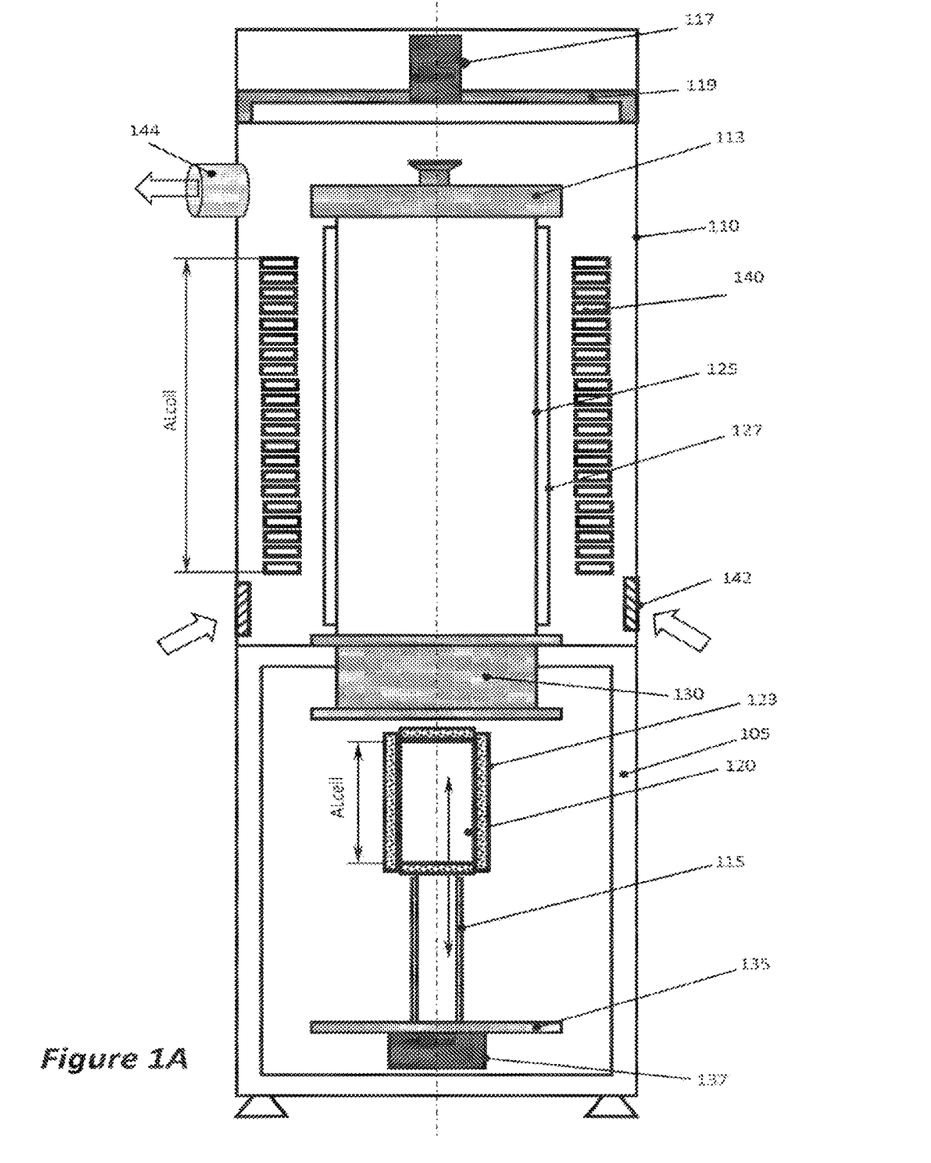
FIG. 1A illustrates an embodiment utilizing convection cooling.

In some embodiments, a mechanism for forced air flow around the exterior wall of the quartz vacuum chamber 122 is provided. In the embodiment of FIG. 1, the forced air mechanism comprises air pump 111 coupled to air conduits 112, and delivering air from bottom to top. The forced air flow exits the enclosure 110 at the top through exhaust connection 144. Conversely, in FIG. 1A the air cooling is achieved by fabricating air intakes 142 at the bottom of the chamber cover, to enable air to enter from the bottom, as exemplified by the arrows. In this example, the air intakes are covered with louvers to assist in laminar flow. An exhaust connection 144 can be led to a blower assisted exhausted ventilation system, to assist in disposing of the hot air.

The internal diameter of the reaction cell is designed to accommodate crystal growth with diameters of from 76 to 200 mm. Similarly, the internal diameter of the RF induction coil is designed to accommodate this growth and may be set to, for example, from 330 to 550 mm or from 330 to 725 mm. In order to maintain the RF field uniformity within the reaction cell, the support of the reaction cell is made of material to which the RF fields do not effectively couple.

EXAMPLES

Example 1—76 mm diameter 4H-SiC Crystal Growth using a traditional coil and new induction coil.

Two identical vacuum furnaces were each fit with a different induction coil. Multiple reaction cells with insulation were prepared identically for SiC sublimation crystal growth using 76 mm 4H-SiC seeds. In the "control" coil furnace, the ratio of the coil axial length to reaction cell axial length was 2.0, while in the "new" coil furnace the ratio of the coil axial length to reaction cell axil length was 3.6. The same process to grow N-doped 4H-SiC crystals was executed in each furnace. The reaction cells were centered within the axial length of the coil and supported by material to which the RF fields do not effectively couple.

Figure 2:
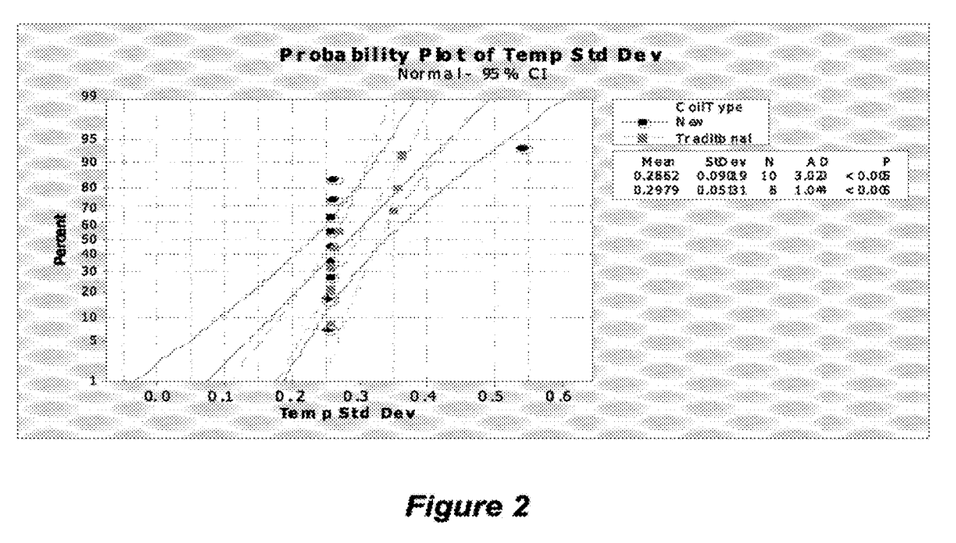
FIG. 2 is a plot illustrating distribution of the standard deviation of temperature stability during the experiment of example 1.

Temperature control stability was tracked during each growth for the steady state temperature value held during the growth stage. The distribution of the standard deviation of this temperature value is plotted in FIG. 2 for all the growth tests in each furnace. FIG. 2 shows that the run-to-run temperature stability was improved with the "new" coil (Ratio=3.6). Temperature is in units of Celsius.

Figure 3:
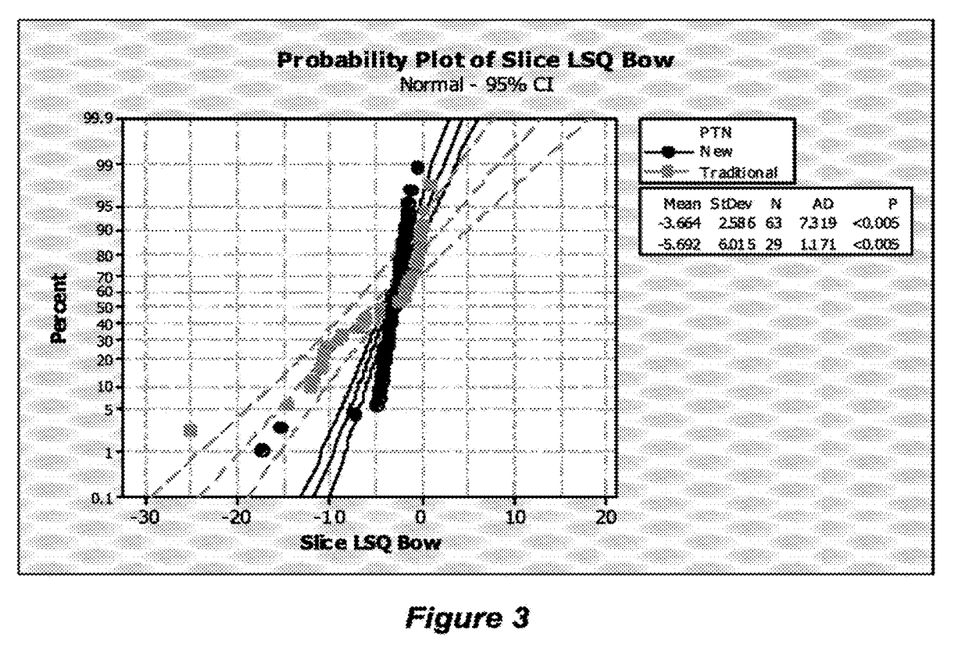
FIG. 3 is a plot of comparison of sliced wafer bow for example 1.
Figure 4:
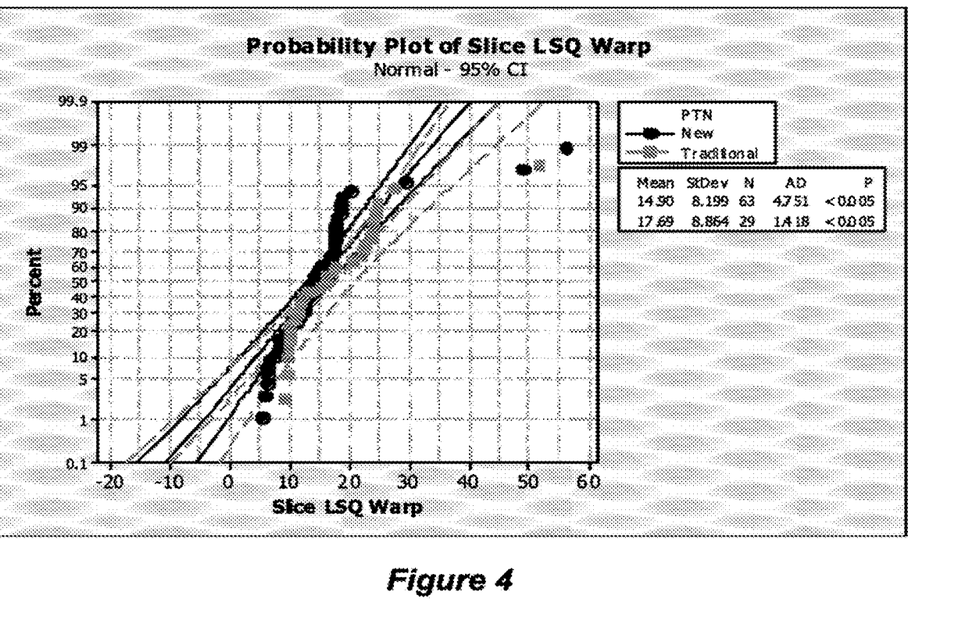
FIG. 4 is a plot of comparison of sliced wafer warp for example 1.

Wafers were sliced using a multiwire slicing system from all the crystals produced using an identical process. FIG. 3 shows the distribution of slice wafer bow and FIG. 4 shows the distribution of slice wafer warp as compared for each furnace. The units of bow and warp are microns. FIGS. 3 and 4 indicate that the crystals from the new furnace exhibit a much tighter distribution of bow and lower value of warp. Since the slicing process imparted the same surface damage to each wafer, the changes in the bow/warp distributions can be attributed to a lower inherent stress in the crystals produced using the new furnace (ratio=3.6).

Example 2—76 mm diameter 4H-SiC Crystal Growth using a control coil and "new" induction coil.

Two identical vacuum furnaces were each fit with a different induction coil. Multiple reaction cells with insulation were prepared identically for SiC sublimation crystal growth using 76 mm 4H-SiC seeds. In the "control" coil furnace, the ratio of the coil axil length to reaction cell axial length was 2.0, while in the "new" coil furnace the ratio of the coil axial length to reaction cell axial length was 3.6. The same process to grow N-doped 4H-SiC crystals was executed in each furnace. The reaction cells were centered within the axil length of the coil and supported by material to which the RF fields do not effectively couple.

Figure 5:
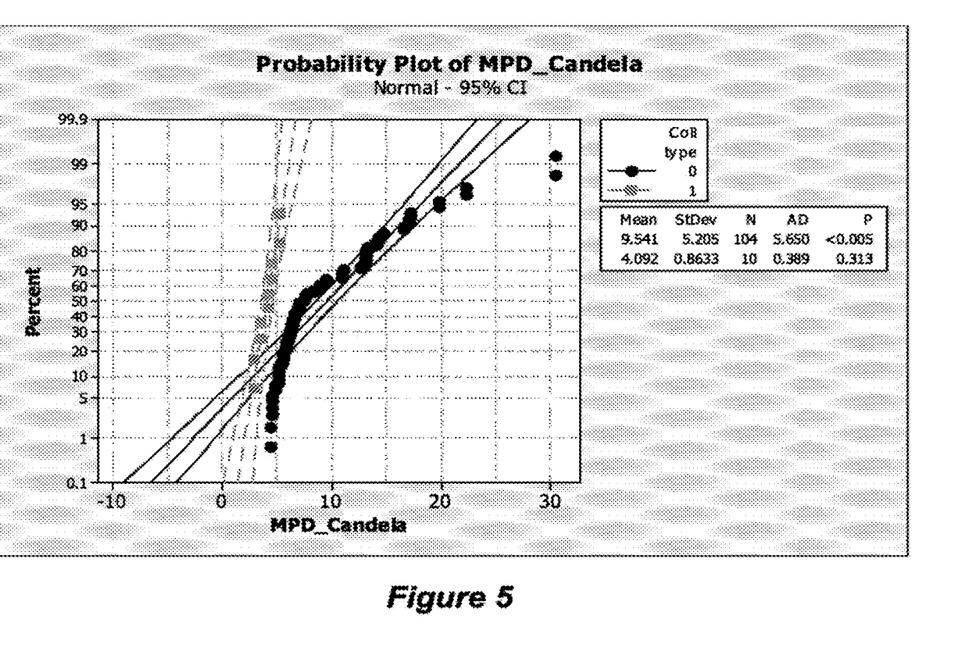
FIG. 5 is a plot that compares the distribution of micropipe density associated with each coil type used in example 2.

The produced crystals were cut into slices and the slices were fully processed into polished wafers. Each wafer was examined using a KLA-Tencor CS2 laser light scanning spectrometry system which is capable to detect micropipes in the polished wafers (J. Wan, S.-H. Park, G. Chung, and M. J. Loboda, "A Comparative Study of Micropipe Decoration and Counting in Conductive and Semi-Insulating Silicon Carbide Wafers," J. Electronic Materials, Vol. 34 (10), p. 1342 (2005)). The measurement determines the total count of micropipes on the wafer and divides that value by the total measurement area. In these measurements the entire wafer was measured with the exception of 2 mm edge exclusion. FIG. 5 compares the distribution of micropipe density associated with each coil type. In FIG. 5 Coil type "0" is the "control" coil and coil type "1" is the "new" coil. Units of the micropipe density are defects/cm2. Inspection of FIG. 5 reveals that the crystals produced with the "new" coil (ratio=3.6) consistently show lower micropipes and have tighter distribution.

Example 3—76-100 mm diameter 4H-SiC Crystal Growth using a traditional coil and "new" induction coil.

Sets of identical vacuum furnaces were each fit with one of 2 different induction coils. Multiple reaction cells with insulation were prepared identically for SiC sublimation crystal growth using 76 mm 4H-SiC seeds. Another set of multiple reaction cells with insulation were prepared identically for SiC sublimation crystal growth using 100 mm 4H-SiC seeds. In the "control" coil furnace, for 76 mm growth the ratio of the coil length to reaction cell length was 2.0, while in the "new" coil furnace the coil length to reaction cell length was 3.6. In the "control" coil furnace, for 100 mm growth the ratio of the coil length to reaction cell length was 1.6, while in the "new" coil furnace the coil length to reaction cell length was 2.9. The reaction cells were centered within the length of the coil and supported by material to which the RF fields do not effectively couple. All the crystals grown were doped with nitrogen corresponding to resistivity of 0.016-0.028 ohm-cm range.

Figure 6:
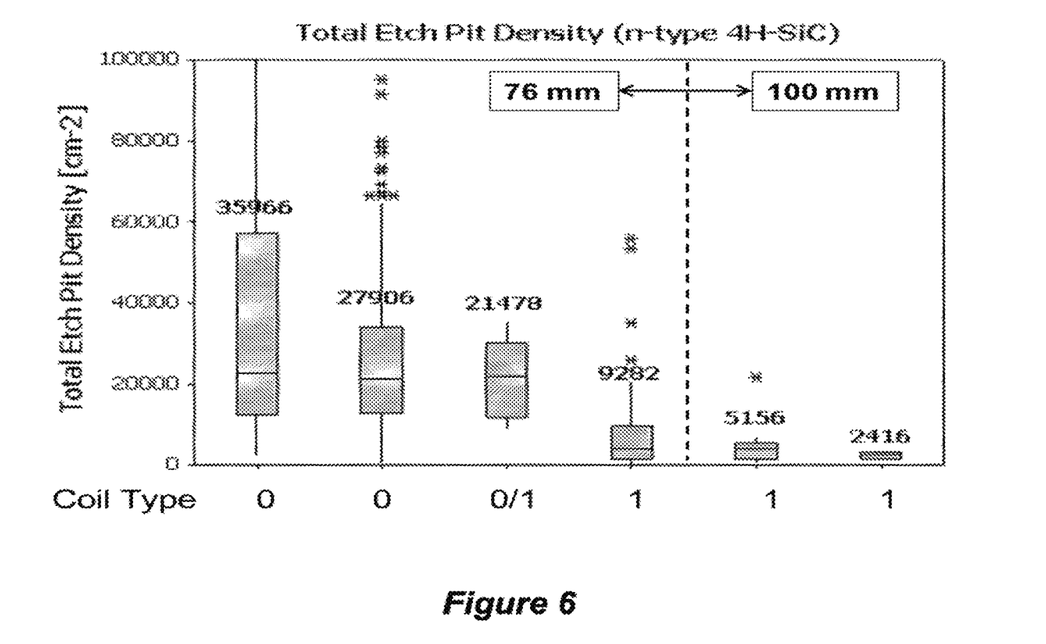
FIG. 6 is a plot of distribution of etch pit density for 76-100 mm n+ 4H-SiC polished wafers of example 3.

Slices were cut from each crystal and etched in molten KOH to reveal dislocation etch pits corresponding to basal, edge, and screw dislocations. The total number of dislocation etch pits were counted at 9 locations on each wafer and then the total count was divided by the measurement area. FIG. 6 shows the trend in the value of etches pit density comparing the traditional and new RF coils.

FIG. 6 shows that as the coil to reaction cell length ratio was increased, there was a correlated drop in the etch pit density in the 4H-SiC crystals, both at 76 mm and 100 mm. Dislocation reduction is typically associated with reduced stress in the crystal during growth. Reduction of parasitic temperature gradients resulting from non-uniform RF fields will lead to reduction of stress during crystal growth.

Example 4. 150 mm diameter 4H-SiC Crystal Growth.

An induction furnace was constructed to support growth of crystals up to 200 mm diameter. An insulated reaction cell was constructed with a 4H-SiC seed wafer and the design corresponds to a coil to reaction cell length ratio of approximately 3.5. A 155 mm diameter 4H-SiC crystal (6B13470010) doped with nitrogen was grown. The crystal was sliced into wafers and examined by x-ray topography. The screw dislocation and basal plane dislocation count was evaluated at 9 sites on a sliced wafer. The dislocation density was determined at each site by dividing the dislocation count by the measurement area. The basal plane dislocation density ranged $3.1$-$6.2 \times 10^3/cm^2$ and the screw dislocation density ranged from $0.25$-$3.75 \times 10^2/cm^2$.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A method comprising:
   positioning a cylindrical RF induction coil coaxially with a quartz vacuum chamber;
   providing a reaction cell, wherein the reaction cell defines an axial length measured as reaction cell height along its axis of rotational symmetry, and wherein a ratio of height of the cylindrical RF induction coil, measured along the axis of rotational symmetry, to the axial length of the reaction cell is from 2.5 to 4.0;
   loading the reaction cell with a seed crystal and source material;
   arranging insulation around the reaction cell for generating a thermal gradient inside the reaction cell;
   placing the reaction cell on a support inside the quartz vacuum chamber;
   rotating the reaction cell inside the quartz vacuum chamber during growth process of a semiconductor crystal;
   energizing the cylindrical RF induction coil for generating an electromagnetic field around the reaction cell when the reaction cell is positioned co-axially with the cylindrical RF induction coil, coaxially to the quartz vacuum chamber, and at a center of the coil with respect to its axial length,
   wherein the support is in a form of a tubular pedestal configured to be movable along the axis of the reaction cell and connected with a bottom base plate configured for contacting a bottom portion of the quartz vacuum chamber,
   wherein a water cooled chamber base is disposed above the reaction cell when the reaction cell is positioned below the quartz vacuum chamber,
   wherein the base plate is attached to a seal adapter to comprise a ferrofluidic seal,
   wherein the rotating of the reaction cell includes the seal adapter, comprising the ferrofluidic seal, rotating the reaction cell during the growth process after the reaction cell is moved through the water cooled chamber base to inside the quartz vacuum chamber.

2. The method of claim 1, wherein the arranging insulation comprises arranging the insulation made of graphite.

3. The method of claim 1, further comprising forcing air flow around exterior wall of the quartz vacuum chamber.

4. The method of claim 1, further comprising positioning a water jacket on exterior wall of the quartz vacuum chamber.

5. The method of claim 1, further comprising configuring the support so that it does not absorb energy from the electromagnetic field and supports the reaction cell inside the quartz vacuum chamber, such that the reaction cell is positioned axially centrally to the axis of rotational symmetry.

6. The method of claim 1, further comprising providing a fiberoptic pyrometer head for temperature measurement.

7. The method of claim 6, further comprising attaching the fiberoptic pyrometer head to an X-Y translation stage to enable measurements at different locations.

8. The method of claim 1, further comprising slicing the semiconductor crystal after growth using a multiwire slicing system.

9. The method of claim 1, wherein the loading of the reaction cell with the seed crystal and source material comprises loading the reaction cell with a 100 mm 4H-SiC seed.

10. The method of claim 1, further comprising doping the semiconductor crystal during growth with nitrogen to generate resistivity of from 0.016 to 0.028 Ohm-cm.

* * * * *